United States Patent [19]

Reinhard

[11] 4,386,651
[45] Jun. 7, 1983

[54] HEAT EXCHANGER ACCESSORY FOR ELECTRONIC CIRCUIT CABINETS

[75] Inventor: Heinrich Reinhard, Heidelberg, Fed. Rep. of Germany

[73] Assignee: Autz + Herrmann Metallwaren-und Maschinenfabrik, Heidelberg, Fed. Rep. of Germany

[21] Appl. No.: 314,219

[22] Filed: Oct. 23, 1981

Related U.S. Application Data

[63] Continuation-in-part of Ser. No. 210,320, Nov. 25, 1980, abandoned.

[30] Foreign Application Priority Data

Dec. 2, 1980 [DE] Fed. Rep. of Germany ....... 3045326

[51] Int. Cl.³ ............................................. H01F 27/20
[52] U.S. Cl. .......................... 165/104.33; 165/104.34; 165/166; 165/76; 336/57; 361/384; 361/385
[58] Field of Search ............. 165/166, 104.33, 104.34; 361/384, 383, 385; 336/55, 57; 174/16 R

[56] References Cited

U.S. PATENT DOCUMENTS 1,648,511 11/1927 Solomiae ............................ 165/166
2,566,310 9/1951 Burns ............................. 165/166 X

FOREIGN PATENT DOCUMENTS 671286 2/1939 Fed. Rep. of Germany ........ 336/57
1860641 3/1961 Fed. Rep. of Germany .
2006759 12/1971 Fed. Rep. of Germany .
1041847 6/1953 France ............................. 165/104.34
2085219 12/1971 France ................................ 361/384
938088 9/1963 United Kingdom ................ 165/166

Primary Examiner—Albert W. Davis, Jr.
Attorney, Agent, or Firm—Frishauf, Holtz, Goodman & Woodward

[57] ABSTRACT

Identical plates of essentially box-like form in which one sidewall of the box is notched out, and a transverse sidewall opposite the notch removed, the plates being stacked edgewise to form a duct assembly with alternatingly appearing openings at the top and bottom and on the front and rear side where the cutouts are positioned. The respective top and bottom openings are connected, respectively, to an ambient air manifold and a blower, and to the interior of the electronic cabinet, with the side cutouts facing, respectively ambient air and the interior of the cabinet to establish two separate air flow circuits and provide for dust-free and contamination free ventilation of the interior of the electronic cabinet while establishing efficient heat exchange by forced air flow of ambient air parallel to the ducts carrying dust-free, but heated air from the cabinet. The plates are preferably assembled together to form a set or assembly unit which can be removed from their position between the top and bottom air manifolds for removal for cleaning as a separate unit.

12 Claims, 7 Drawing Figures

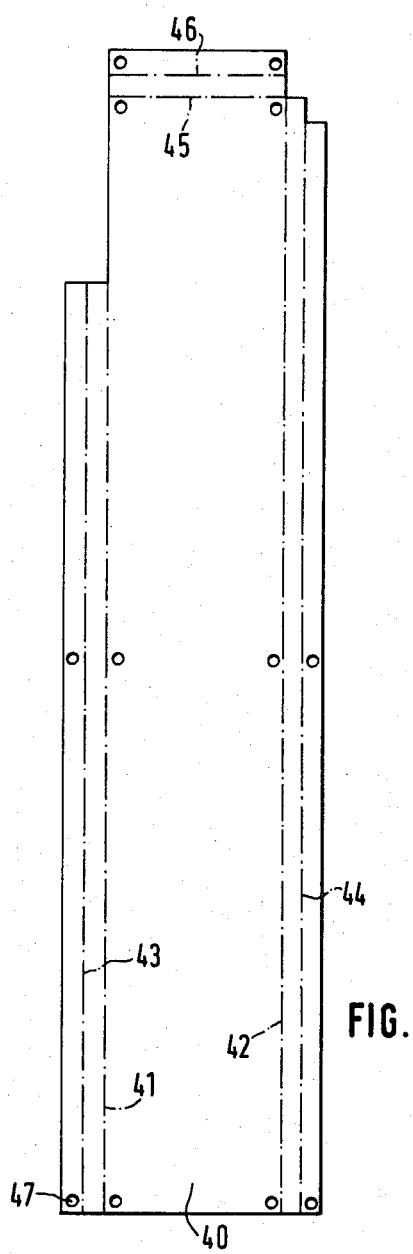

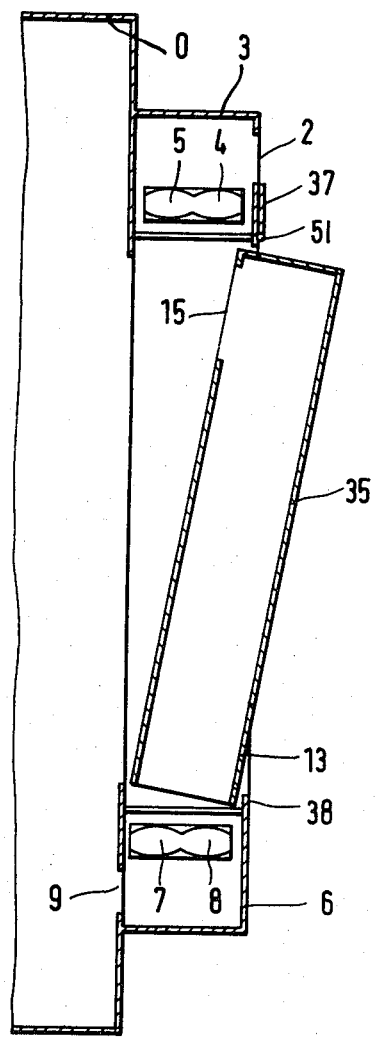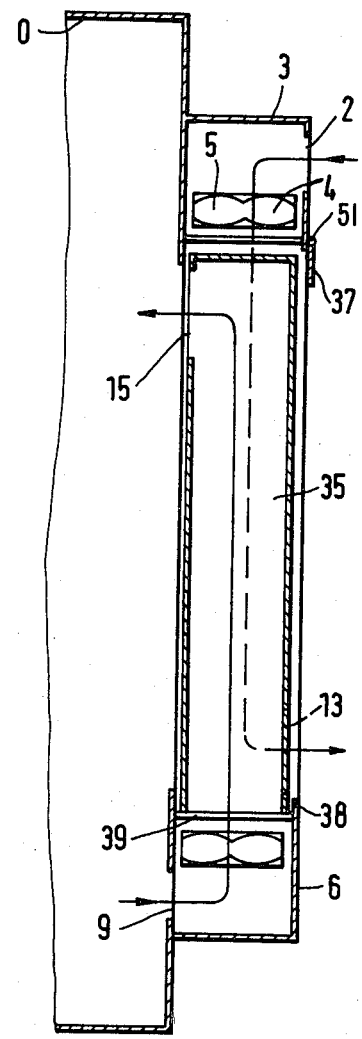

HEAT EXCHANGER ACCESSORY FOR ELECTRONIC CIRCUIT CABINETS

This application is continuation-in-part of my earlier application Ser. No. 210,320, filed Nov. 25, 1980, now abandoned.

The present invention relate to cooling of electronic equipment, and more particularly to a heat exchanger accessory in which dust-free, clean air which becomes heated by contact with electronic apparatus is cooled in a heat exchanger through which ambient air is caused to circulate.

BACKGROUND

A heat exchanger has previously been proposed—see German published patent application DE-AS No. 20 06 759—in which a sidewall or a door formed is of an undulating sheet metal element so that ducts or channels for a cooling fluid are formed thereby, the respective ducts being separated from each other by the undulation in the sheet metal element. Dust-free cooling of the interior of an electronic circuit cabinet, and the elements retained therein is thus possible.

The ducts formed by the undulating sheet metal are not tightly closed with respect to each other, so that air can escape along the folds or pleats thereof. The air ducting or guidance thus is subject to improvement. Such an undulating sheet metal element is difficult to make with high accuracy if the various folds or undulations are bent, one after the other. To make such an undulating element in one stamping operation is very expensive. It is thus practically not possible to make a sheet metal undulating guide for air cooling of circuit elements from one die due to economic constraints.

It has also been proposed to combine a heat exchanger surrounded by a housing, preferably for a dehumidifer system—in which ducts of the heat exchanger are formed by a package of similar plates which are fitted together. The plates have bent-over lateral edges and a transverse edge—see German Utility Model Patent DE-GM No. 1 860 641. The lateral edges of the plates, in the vicinity of the end faces thereof are formed with recesses. Adjacent sequential plates of the package are so set with respect to each other that the lateral recesses of adjacent plates come to lie at different ends of the heat exchanger. This arrangement is a package of plates located within a housing surrounding it at all sides, through which air enters from both sides through the lateral recesses within the plates forming a first heating zone. The open end or face side of the plates then permits the air to reach an evaporater from which it enters the other portion of the housing to be removed again from the lateral recesses into the ducts of the second heat zone, to leave the heat exchanger in dehumidified condition. The very same air stream thus is temperature treated in this heat exchanger. The heat exchanger temperature is entirely surrounded by the housing which makes cleaning and assembly of the plates with the angled-up sidewalls, stacked together, quite difficult.

THE INVENTION

It is an object to provide a heat exchanger for association with an electronic cabinet to permit dust-free cooling of the electronic circuit elements in the cabinet, which is simple to construct, easy to clean, and which can be secured to the electronic cabinet such that the cabinet is easily accessible and which is compact and requires but little additional space adjacent the electronic cabinet.

Briefly, in accordance with the invention, the heat exchanger is formed of a combination of essentially rectangular stacked plates, each having oppositely located edge portion projecting in the same direction at right angles of the major plane of the plate to form side flanges, and one shorter side portion likewise projecting in the direction to form an end flange. One of the side flange is shorter than the other to form a cut-out or notch, positioned adjacent a flange. The plates are assembled in a stacked package with adjacent plate reversely oriented, so that the cut-out or notch of adjacent plates will be at respectively opposite end portions of the package of the rectangular plates. The package is applied to the cabinet with the plates extending at right angles to the wall thereof. The plates, thus, form adjacently positioned ducts which are open at opposite ends and, additionally, have a facing opening located at opposite end portions. The respectively open opposite ends are connected to respective manifolds or manifold boxes, at least one, and preferably both of which have blowers positioned therein. The manifold box which is in air flow communication, through the blowers, with the ducts facing outwardly or away from the cabinets is formed with openings extending outwardly, so that an air flow of ambient air will be induced through those ducts by the blowers; the plates in which the cutouts or notches face inwardly, towards the cabinet, are in air flow communication directed towards the cabinet, so that air flow communication is established in a closed cycle from within the cabinet, through the opening in the manifold, the ducts, and out through the notches or cutouts of the plates back into the cabinet. Purified, dust and contamination free air which is heated due to heat dissipation of electronic components within the cabinet thus is cooled by passing through the associated ducts formed by the plates, which, in turn, are cooled by ambient air.

It has been found that the ducts or channels may become dusty or contaminated, particularly when operating in an ambient environment in which the air is dusty and dirty, requiring periodic cleaning. In accordance with a feature of the invention, the heat exchanger is so arranged that it can be assembled as a single unit and removed from the housing as a single unit leaving, preferably, the blower assembly installed. The package or assembly of cooling plates are interconnected and can be removed from the housing as a single unit, for example for cleaning in a bath containing solvent, and for reinsertion thereafter. In some installations, it may be desirable to have an extra set of cleaning plates on hand which can be exchanged for contaminated ones for subsequent cleaning of the contaminated set. By combining the plates into a set, removal of contaminated heat exchanger plates and insertion of clean ones can be carried out rapidly, so that it is usually not even necessary to disconnect the electronic equipment which generates heat which is to be removed, thereby avoiding any interruption in continued operation of the electronic equipment.

This structure and system has the advantage that a closed-cycle heat exchanger is provided without requiring substantial amount of space adjacent the electronic cabinet while insuring reliable guidance of clean, contamination and dust free air while having a high degree of efficiency with respect to heat exchange and cooling capacity, and being easy to maintain.

DRAWINGS

Figure 1:
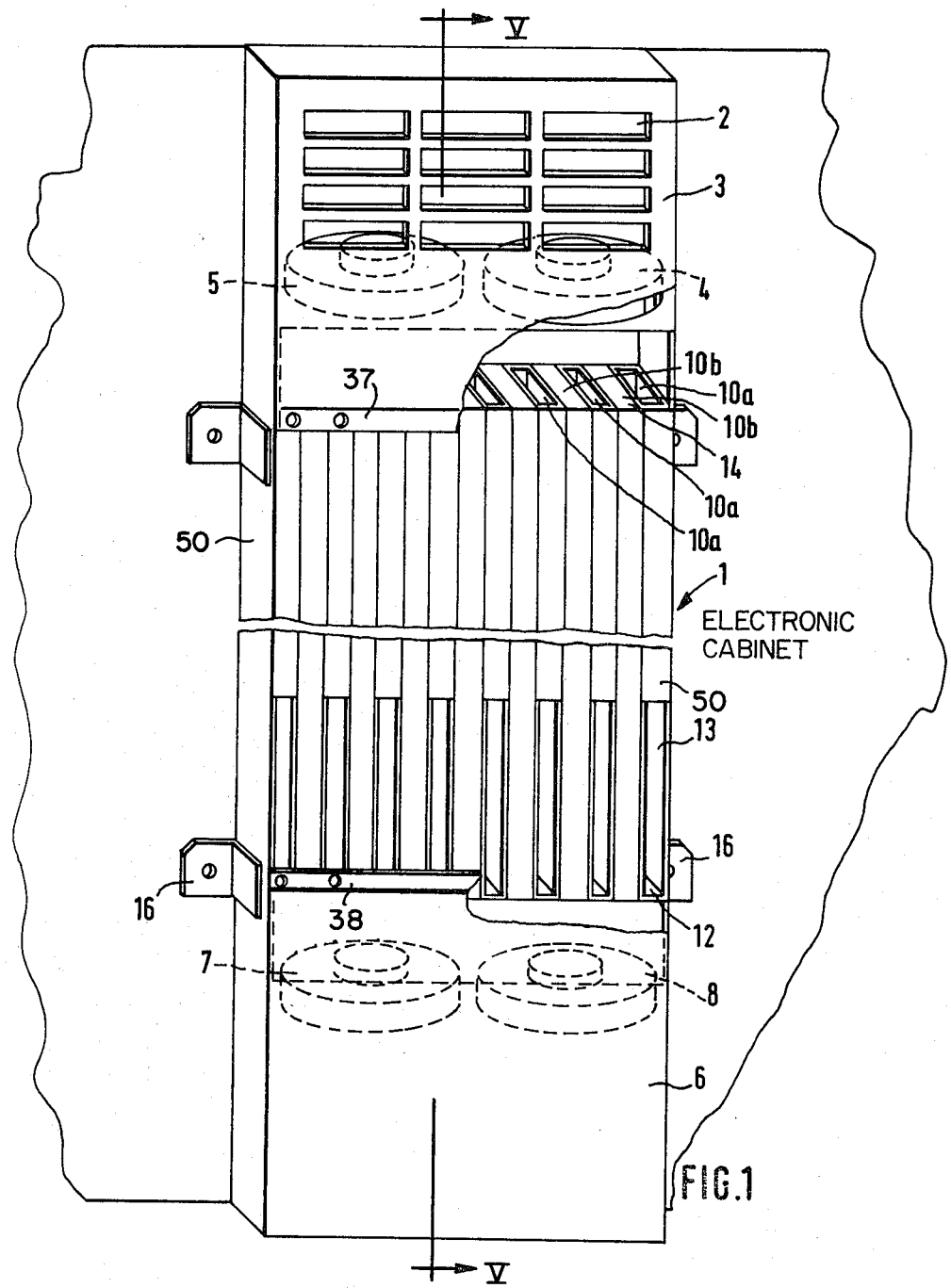
FIG. 1 is a part prospective, part phantom, part broken away from view of the exchanger structure.
Figure 3:
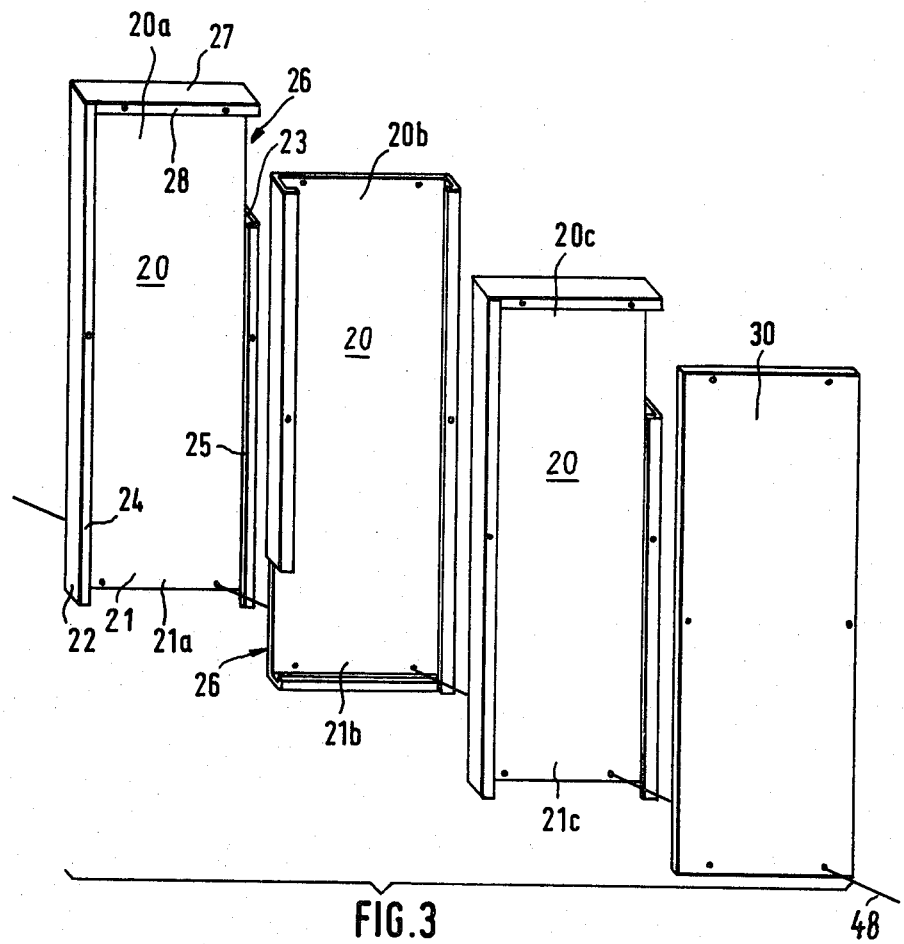
Figure 7:
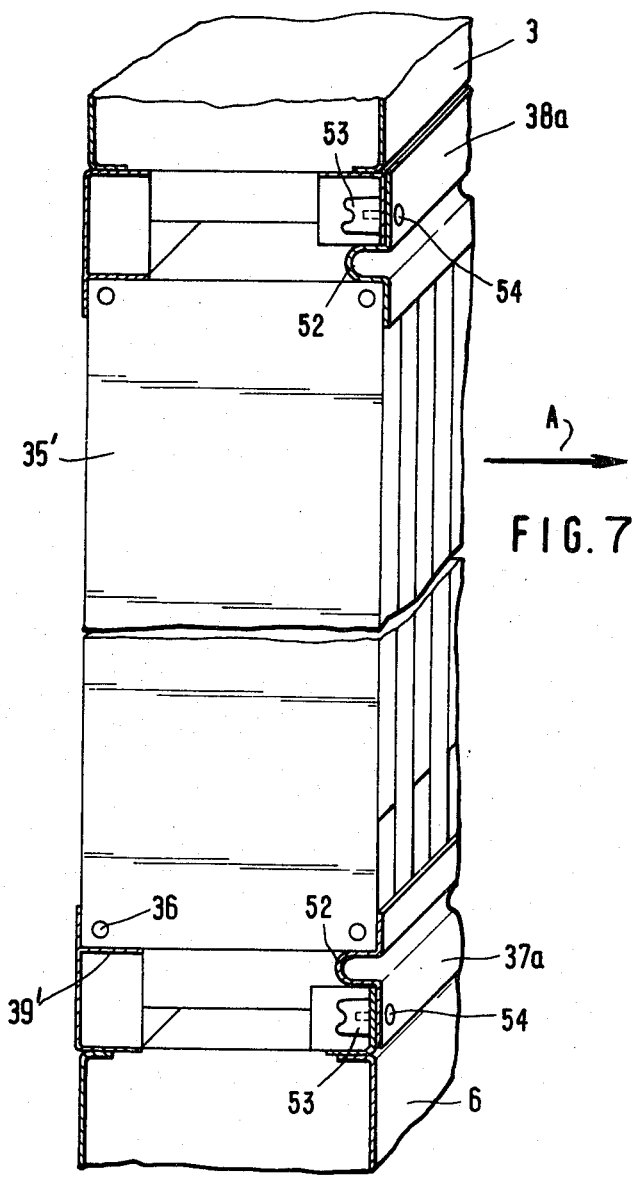

FIG. 3 an exploded view of a portion of the plate assembly to a different scale;

FIG. 4 is a plan view of a blank from which a plate for the plate assembly can be formed;

FIGS. 5 and 6 are schematic illustrations of the heat exchanger cut along line V—V of FIG. 1, to a different scale, and illustrating, respectively, a package of heat exchanger plates installed, the air flow therethrough, and in partially removed condition; and FIG. 7 illustrates the heat exchanger of FIG. 1, cut along line V—V thereof in partly perspective side view to another scale and illustrating another embodiment of the invention.

Figure 2:
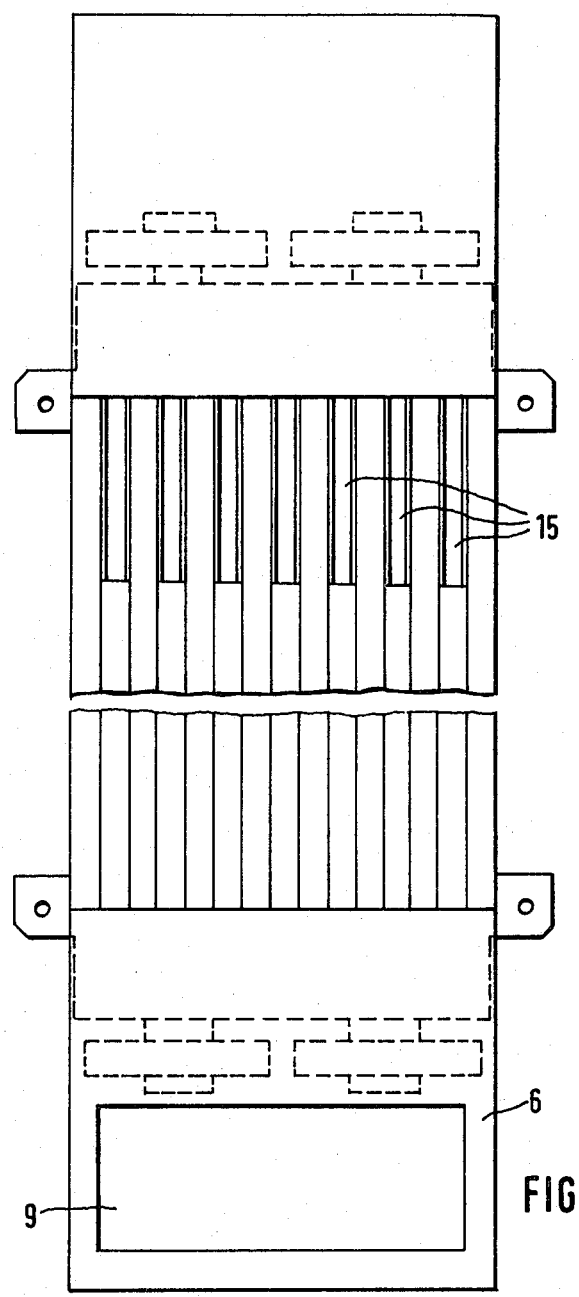
FIG. 2 is a rear elevational view.

The heat exchanger has two air cooling circuits for dust-free cooling of an electronic cabinet. The upper end portion is formed by a box-like manifold 3 having an air ingress opening formed by ventilating slots 2. Two blowers 4, 5 are located in the box 3. The lower end of the heat exchanger 1 is formed by a further box 6, in which two blowers 7, 8 are located. Box 6 is formed with an air communication opening 9—as seen in FIG. 2—facing the side opposite the openings 2 in box 3 of the heat exchanger 1. The opening 9 is in air flow communication with the electronic equipment for example with the interior of the electronic cabinet.

The heat exchanger 1 is defined by adjacently positioned ducts 10a and 10b. The duct 10a are open in the upward direction into the box 3, and closed off at the lower end in the direction of box 6 by closing plates 12. The ducts 10a are open to ambient air at the front side, as seen at 13, that is facing the same direction as the openings 2 in box 3. Air received through openings 2 and blown by blowers 4, 5 in the ducts 10a can thus return to the ambient space through the openings 13.

The ducts 10b are closed off with respect to box 3 by transverse plates 14 and, as seen in FIG. 2, have openings 15 which face the same direction as the opening 9 in the box 6. Thus, air blown into the ducts 10b by blowers 7, 8 through the opening 9 can be transmitted into the cabinet through the openings 15.

The assembly is attached to an electronic cabinet by flange attachments 16; the openings 15 and 9 are in air-flow communication with the interior of the cabinet, whereas the ventilating slots 2 and the opening 13 are in air-flow communication with ambient, surrounding air.

The ducts 10a, 10b are, respectively, formed by plates 20 (FIG. 3) which have a bottom plate 21 and two laterally angled-off flanges 22, 23. The flanges 22, 23 have further angled edge portions 24, 25, extending in a direction parallel to the plane of the bottom 21. The edge 23 is foreshortened at one end of the plate 20 to form a cutout or notch 26 which, when placed adjacent another similar plate, will form, respectively, the opening 13 or 15 (FIG. 1). Each one of the plates 20 have end plates 27 formed thereon which, likewise, have a stiffening rib or angle 28, similar to the stiffening ribs or angles 24, 25.

As best seen in FIG. 3, all the plates which form the heat exchanger 1 are identical, but, respectively, placed offset by 180° with respect to an axis at right angles to the plane of the plate 21, so that the respective notch 26 at every second plate will be upwardly oriented and, with reference to FIG. 3, will face to the right whereas the similar cutout 26 of the intermediately located plate 20 will be at the lower portion, and face to the left. The respective plates in FIG. 3 have been given the subscripts a, b, c, respectively so that orientation of the plate elements with respect to each other will be clearly apparent. Thus, the plate 20a has the opening 26 at the upper side; its bottom plate 21a is parallel to the bottom plate 21b of the next adjacent plate 20b, and, in turn, parallel to the bottom of plate 21c of the third adjacent plate 20c. The plates are assembled in stacked relationship such that the notch or cutout 26 of plate 20a will be at the upper side; the plate 20b is placed immediately adjacent thereto so that its bottom 21b will fit on the ribs 24, 25 of the flanges 22, 23. The cutout 26 of the plate 20b then will be at the bottom portion. A further plate 20c is secured to the plate 20b which, again, will have the same orientation as plate 20a, and its bottom plate 20c will fit against the respective ribs of the flanges of plate 20b. The number of adjacently positioned plates will depend on the heat energy to be removed from the electronic cabinet; as many plates as necessary, can be placed adjacent each other in stacked relationship, with the cutouts or notches 26 alternatingly being at the upper and lower portion, and facing, alternatingly, right or left, as seen in FIG. 3. The last plate in the stack, in FIG. 3, the plate 20c is closed off by simple plane plate 30.

The alternating arrangement of identical plates 20 forms the ducts 10a, 10b of the heat exchanger structure 1 (FIG. 1) which are defined in each instance by the bent-up flanges 22 and 23, and the bottom 21 of one plate and the bottom 21 of the respectively adjacent next plate 20. The alternating orientation of the plates 20 results in ducts 10a, 10b which, alternatingly, are open towards the top and towards the bottom while separating the ducts from each other so that air currents can be conducted through the adjacent thus formed ducts.

A blank from which the plates 20 can be formed, for example, sheet metal, is shown in FIG. 4. A sheet metal strip 40 is formed with creasing lines 41, 42, 43, 44, over which the plate can be bent. By bending the strip 40 along the crease lines 41, 42, the upstanding flanges 22, 23 will be formed; further bending along the creases 43, 44 forms the stiffening ribs 24, 25; by bending along the crease line 45, 46, the end flange of the respective duct is formed. Before creasing the blank, and, for example, upon punching the plates to shape them in the form shown in FIG. 4, holes 47 can be formed therein through which, at a later time, through-bolts are guided to hold the plates 20 of the heat exchanger 1 in a stacked combination. It is not necessary to make these holes or to use connecting bolts; the respective separate plates can also be irremovably connected by welding or adhesion. The plates can be made of sheet metal or of plastic in which case it is preferred to connect plates by adhesion to thereby improve the tightness of the plates with respect to each other.

In some installations, and particularly those where the ambient air is contaminated or contains a high degree of dust and other suspended particles, cleaning of the heat exchanger 1 will be required at more frequent intervals than in essentially "clean" environments. To permit easy cleaning, and in accordance with a feature of the invention, the plates 20 together with the terminal closing plate 30, are assembled together to form a unitary assembly or package 35(FIGS. 5,6) which, in cross section, will be a single rectangular body. Plates 20 and the terminal plate 30 can be connected together by bolts 36 which can fit through holes 47 (FIG. 4) unless the assembly of plates is formed by welding or adhesion.

The assembly of plates 35—see FIGS. 5 and 6—is so attached to the wall of the heat generating equipment 0, that the plane of the plates 20 extends at a right angle to the wall of the equipment 0. The package of plates is releasably fitted in the box 3, retaining the blowers 4 and 5, and in the box 6, retaining the blowers 7 and 8, in such a manner that all the plates can be removed as a single assembly and unit, the boxes 3, 6 remaining adhered to the wall of the equipment 0. Various attachment arrangements can be provided to secure the plates to the respective boxes, but permit their release without taking off the entire cooling assembly, that is, permitting the boxes 3, 6 and the blower equipment therein to remain associated with the equipment to be cooled.

In the embodiment illustrated in FIGS. 1, 5 and 6, the holding arrangements are secured to the boxes 3, 6 and include clamping strips 37, 38 extending over the edge of the respective boxes 3, 6. The clamping strips 37, 38 fit over the package of plates 35 when the plates are in the operating position shown in FIG. 5. The weight of the package of plates is accepted by the upper wall 39 of the box 6, and is laterally retained by the side walls 50—see FIG. 1—of the cabinet 1. The upper strip 37 is so secured to the box 3 that it can be flipped upwardly about a hinge 51. The strip 37 is locked in closed position when the assembly 35 is to be in the operative position shown in FIG. 5, by suitable holding elements such as screws, bolts, or the like. After loosening of the locking elements, the upper strip 37 is pivoted over the horizontally arranged pivot axis 41 to assume the position shown in FIG. 6, and permitting removal of the assembly of package 35 of the plates by tilting the plate assembly outwardly from between the side wall 50 of the housing 0. Various other different ways of holding the package or assembly 35 of the plates together may be used; for example, the lower holding strip 38 also could be made removable, or pivotable; magnetic holding elements and the like can also be used to maintain the package 35 in position since their weight, essentially, is taken up by the walls 39 of the box 6 and they only have to be prevented from tipping.

The assembly 35 can then be cleaned, for example in a bath or trough with solvent therein, and then reinserted, the upper holding strip 37 then being returned to the position of FIG. 5 and locked in place. In severe environments where the plates 20 are severely contaminated, it may be desirable to have on hand a spare assembly or set of plates for rapid exchange of a clean assembly with a contaminated one and subsequent cleaning of the dirty one. Thus, the equipment to be cooled can continue to operate without interruption or excessive rise of temperature.

FIG. 7 illustrates another embodiment in which the assembly 35' of the plates is fitted on the lower box 6 and placed on a bracket 39' located in the vicinity of the back side of the box. Holders in the form of clamping strips 37a, 38a are provided at the front side of the assembly. The holders are formed with an inwardly extending ridge 52 and are releasably secured to the box 3, 6 by screws 54. Screws 54 are screwed into suitable sheet metal flaps 53 formed in the respective box 3, 6. To disassemble the set of plates 35', screws 54 are released, and the strips 37a, 38a are removed, whereupon the assembly 35' can be pulled outwardly at the front side, that is, towards the right in the direction of the arrow A (FIG. 7). Boxes 3, 6 remain on the wall of the heat exchange unit.

The set of plates 35 can also be built up by forming the plates which define the ducts 10a, 10b as unitary elements with upwardly bent lateral edges, so that the sheet metal element will be meander-shaped, formed with the respective openings 13, 15 therein.

Various changes and modifications may be made, and features described in connection with any one of the embodiments may be used with any of the others within the scope of the inventive concept.

I claim:

1. Dust-sealed heat exchanger to cool dust-free air cooling air, for association with, or assembly to an electronic circuit cabinet (0, 50) having first (4, 5) and second (7, 8) blower means for circulating air;

first means (10a) defining a cooling air flow circuit in communication with ambient air and second means (10b) defining a dust-free air flow circuit in air flow communication with the interior of the cabinet, said air flow circuits being separated in dust-free sealed relation with respect to each other;

comprising the combination of a package of essentially rectangular identically stacked plates (20), each having oppositely located edge portions projecting in a first direction and at right angles from the major plane of the plate to form side flanges (22, 23) and having a further side portion projecting from the major plane of the plate at a right angle to form an end flange (27);

one (23) only of the side flanges being shorter than the other to form a cut-out or notch (26) adjacent the end flange (28);

said plates being assembled in said package with adjacent plates being reversely oriented so that the cut-out or notch (26) of adjacent plates will be at respectively opposite end portions of the package of the plates;

stiffening ribs (24, 28) formed at the marginal end portions of said flanges and extending in a plane parallel to the major plane of an adjacent plate, the stiffening ribs being bonded to a next adjacent plate at the side opposite said first direction thereof to provide dust-tight sealing engagement therewith;

said package being applied to the cabinet with the plates extending at right angle to a wall thereof;

a first manifold box (3) positioned at an end portion of said package of plates and retaining said first blower means (4, 5);

a cooling air flow communication opening (2) communicating with ambient air formed in said first manifold;

a second manifold box (6) positioned at the other end of the package of plates and retaining said second blower means (7, 8);

a dust-free air flow communication opening (9) communicating with the interior of the cabinet, said package being oriented such that the plates which are open at the end portion and in air flow communication with the first manifold have their cut-outs or notches (26) facing ambient air, and adjacent plates, which are open at the end portions and in air flow communication with the second manifold have their cut-outs or notches facing the interior of the cabinet, the plates with their respectively differently positioned cut-outs or notches

(26) separating said air flow circuits while providing for heat exchange through the thickness thereof;

and a cover plate (30) closing off the flanges of the final plate of the package.

2. Heat exchanger according to claim 1 wherein the stiffening ribs (24, 28) and the plates are adhesively joined.

3. Heat exchanger according to claim 1 further including attachment means (36, 48) securing said plates in aligned, attached assembly.

4. Heat exchanger according to claim 1, further comprising an elongated housing structure (50);

the first manifold box (3) being positioned adjacent one end portion of the housing structure, the second manifold box (6) being positioned at the other end portion of said housing structure;

and wherein said package of plates (20) forms a unitary assembly (35, 35') positioned between said manifold boxes (3, 6);

and releasable locking means (37, 38; 37a, 38a), releasably retaining said assembly (35, 35') within the housing structure to permit release of the assembly from the housing structure without disturbance of said first and second manifolds (3, 6).

5. Heat exchanger according to claim 4, wherein the releasable locking means comprises holding elements (37, 38) secured to at least one of the manifolds, engageable with the assembly (35, 35') formed by the package of plates (20) and selectively movable between engaged and not engaged position to permit locking and unlocking of said assembly within the housing structure.

6. Heat exchanger according to claim 5, wherein said locking means comprises clamping strips (37, 38; 37a, 38a) overlapping an edge or rim portion of the assembly (35, 35').

7. Heat exchanger according to claim 6, wherein at least one of said holding strips is removable from the assembly.

8. Heat exchanger according to claim 6, wherein at least one of said holding strips is pivotably secured to the respective box (3, 6).

9. Heat exchanger according to claim 6, wherein at least one of said holding strips (37a, 38a) is formed with a support abutment (52) for said assembly.

10. Heat exchanger according to claim 4, further including attachment means (36, 48) securing said plates in aligned relation, attached to each other, to thereby form said unitary assembly.

11. Heat exchanger according to claim 4, wherein the stiffening ribs (24, 28) and the plates are adhesively joined.

12. Heat exchanger according to claim 11, further including attachment means (36, 48) securing said plates in aligned relation, attached to each other, to thereby form said unitary assembly.

* * * * *